(12) United States Patent
Zhuang et al.

(10) Patent No.: US 6,762,064 B1
(45) Date of Patent: Jul. 13, 2004

(54) PROCESS FOR FABRICATION OF A FERROCAPACITOR

(75) Inventors: Haoren Zhuang, Tokyo-to (JP); Ulrich Egger, Kanagawa-ken (JP); Kazuhiro Tomioka, Kanagawa-ken (JP)

(73) Assignees: Infineon Technologies AG (DE); Kabushiki Kaisha Toshiba (JP)

( * ) Notice: Subject to any disclaimer, the term of this patent is extended or adjusted under 35 U.S.C. 154(b) by 0 days.

(21) Appl. No.: 10/417,526

(22) Filed: Apr. 17, 2003

(51) Int. Cl.⁷ .............................................. H01L 21/00
(52) U.S. Cl. ......................... 438/3; 438/240; 438/713; 438/720; 438/736
(58) Field of Search ........................... 438/3, 240, 253, 438/255, 398, 713, 720, 735, 736

(56) References Cited

U.S. PATENT DOCUMENTS 5,515,984 A * 5/1996 Yokoyama et al. ............ 216/41
6,497,992 B1 * 12/2002 Yunogami et al. ........... 430/313
6,500,678 B1 * 12/2002 Aggarwal et al. ............. 438/3
6,611,014 B1 * 8/2003 Kanaya et al. ............... 257/295
2003/0170998 A1 * 9/2003 Mise et al. ................. 438/710

* cited by examiner

*Primary Examiner*—Tuan H. Nguyen
(74) *Attorney, Agent, or Firm*—Lerner, David, Littenberg, Krumholz & Mentlik, LLP

(57) ABSTRACT

A process for the fabrication of a ferrocapacitor comprising depositing a first mask element 7 over a structure having a bottom electrode 1, a ferroelectric layer 3 and a top electrode 5. RIE etching is performed to remove portions of the top electrode 5 and the ferroelectric layer 3. Then a second hard mask element 9 is deposited over the first hardmask element. The second hard mask element is rounded by an etch back process, and its taper angle is controlled to be in the range 75–87°. A second RIE etching process is performed to remove portions of the bottom electrode 1. Due to the rounding of the second hard mask elements 9 low residues are formed on the sides of the etched bottom electrode 1.

10 Claims, 6 Drawing Sheets

US 6,762,064 B1

PROCESS FOR FABRICATION OF A FERROCAPACITOR

FIELD OF THE INVENTION

The present invention relates to fabrication processes for ferroelectric devices which include one or more ferrocapacitors, and to ferroelectric devices produced by the fabrication processes.

BACKGROUND OF INVENTION

It is known to produce ferroelectric devices such as FeRAM devices and high k DRAM devices including ferroelectric capacitors produced by depositing the following layers onto a substructure (frequently including a barrier film); a bottom electrode layer, a ferroelectric layer, and a top electrode layer. Hardmask elements, typically formed Tetraethyl Orthosilicate (TEOS), are deposited over the top electrode layer, and used to etch the structure so as to remove portions of the bottom electrode layer, ferroelectric layer, and top electrode layer which are not under the hardmask elements. The etching separates the top electrode layer into top electrodes, the bottom electrode layer into bottom electrodes, and the ferroelectric layer into ferroelectric elements sandwiched by respective pairs of top electrodes and bottom electrodes.

It is known to perform this etching process using a two stage etching process, using first hardmask elements to etch the top electrodes in a first stage, and second hardmask elements to etch the bottom electrode in a second stage.

The second stage of such a process is illustrated in FIGS. 1(a) to 1(e). As shown in FIG. 1(a), following the first stage of etching a structure is formed having an (un-etched) bottom electrode layer 1 covering a substructure 6 (generally comprising a barrier layer and a plug extending downwardly for electrically connecting the bottom electrode to other elements of the device).

Over the bottom electrode layer 1 is a ferroelectric layer 3 and a top electrode layer 5. The top electrode layer 5 and ferroelectric layer 3 have already been etched, using first hard mask elements 7 and an etching process, such as reactive ion etching (RIE).

The process for forming the second hard mask elements used for etching the bottom electrode 1 begins by depositing a TEOS layer 4, and covering portions of it with resist 8 by a lithographic process. Then, as shown in FIG. 1(b), the TEOS layer 4 is etched, leaving the portions under the resist 8 protected. The portions are the second hard mask elements 9. Then, as shown in FIG. 1(c), the resist 8 is removed (a process referred to as "ashing"). The process shown in FIGS. 1(a) to 1(c) is referred to as "hard mask opening" (i.e. the formation of the second hard mask elements 9). The second hard mask elements 9 have an initial taper angle marked as α. The second hard mask elements 9 are wider than the first hard mask elements 7, so that there is a fringe 11 at the outer areas of the second hard mask elements 9 where they directly contact the bottom electrode 1.

The second hard mask elements 9 are then used to etch the bottom electrode 1 by a second etching process, such as a RIE process (this is called "bottom electrode RIE etching"). According to the value of α, the resultant structure may be as shown in either of FIG. 1(d) or FIG. 1(e). Initially, as shown in FIG. 1(c), the second hard mask elements 9 have well-defined corners 15, but during the second etching process, they become rounded.

One of the advantages of using a two stage process to fabricate the ferrocapacitor is that one can adjust the width of the fringe 11. Also, the angle of the sides of the remaining portions of the bottom electrode 1 can be selected. This can be seen from FIGS. 1(d) and 1(e). If the taper angle α of the second hard mask element 9 is almost 90°, it leads to a taper angle β of the sides of the bottom electrode which is almost 90° as shown in FIG. 1(d). If the taper angle α of the second hard mask element 9 is lower, it leads to a taper angle β of the sides of the bottom electrode 1 which is also lower. In the case of high taper angle α the fringe 11 is wider, which leads to less damage to the bottom electrode 1, because of the protection given to it by the second hard mask element 9.

Looking more closely at the FIG. 1(d) however, it can be seen that in the case that the taper angle of the second hard mask elements 9 is high there is a thick residue 13 deposited on the sides of the second hard mask elements 9 and the bottom electrode 1. This is because residues accumulate easily on such a hard mask. These residues can cause problems in later stages of the device fabrication process, such as the oxidation of the plug.

Note that variations of the process shown in FIGS. 1(a) to 1(e) are known, in which there are multiple ferroelectric capacitors under each of the second hard mask elements 9. Two such capacitor elements 10, 12 are shown in FIG. 1(f), each having the structure of the elements 3, 5, 7 of FIG. 1(a). When the hard mask opening is performed, followed by etching of the bottom electrode 1, this leads to the structure shown in FIG. 1(g).

SUMMARY OF THE INVENTION

The present invention aims to address the problems above.

In general terms, the present invention proposes that the second stage of the two stage etching process should be performed including a process to round the shape of the second hard mark elements before the bottom electrode etching. When the etching of the bottom electrode beings, the second hard mask elements may have a taper angle α in the range 75° to 87°.

Since the taper angle is relatively high, a capacitor can be formed with relatively little damage. However, we have found that due to the rounding process, the formation of residues is dramatically reduced. This is since residues are hardly formed on the upper part of the sides of the second hard mask elements.

The rounding process is referred to here as an etch back process.

In this method, the resist which was used to form the second hard mask elements may be wholly removed, or at least reduced in thickness (e.g. during the etching process itself) to the extent that it is no longer able to fully protect the second hard mask elements, and further RIE etching is performed on the second hard mask elements prior to the bottom electrode etching step.

The taper angle α can be controlled (reduced to a desired angle) during the etching of the second hard mask layer, such as by controlling the flow rate of $O_2$ and chamber pressure. Alternatively, it can be controlled by a process step which is separate from the etching step (e.g. performed after the hard mask elements have been rounded and before the bottom electrode etching) using a low bias $CF_4$ etching step to adjust the taper angle after the ashing step, such as from almost 90° to a selected value.

BRIEF DESCRIPTION OF THE FIGURES

Preferred features of the invention will now be described, for the sake of illustration only, with reference to the following figures in which.

DETAILED DESCRIPTION OF THE EMBODIMENTS

Figure 1A:
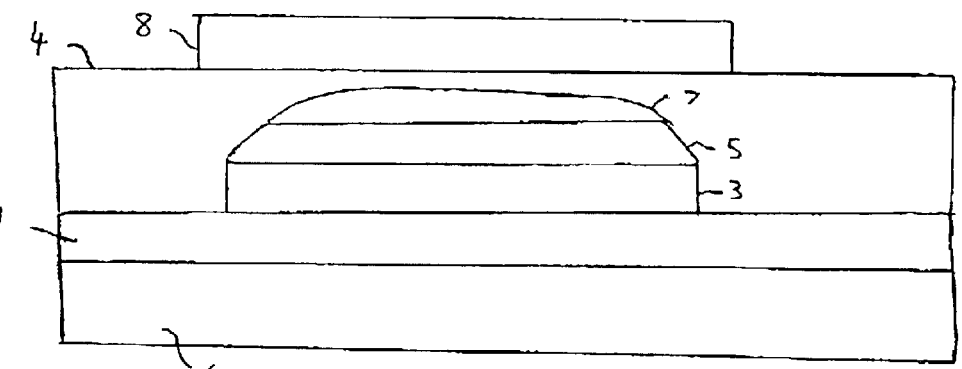
FIG. 1, which is composed of FIGS. 1(a) and 1(f), shows a known ferrocapacitor formation process.
Figure 1B:
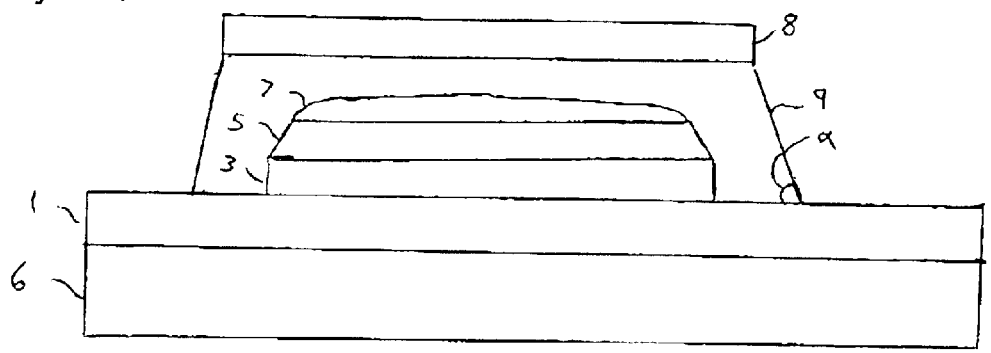
Figure 1C:
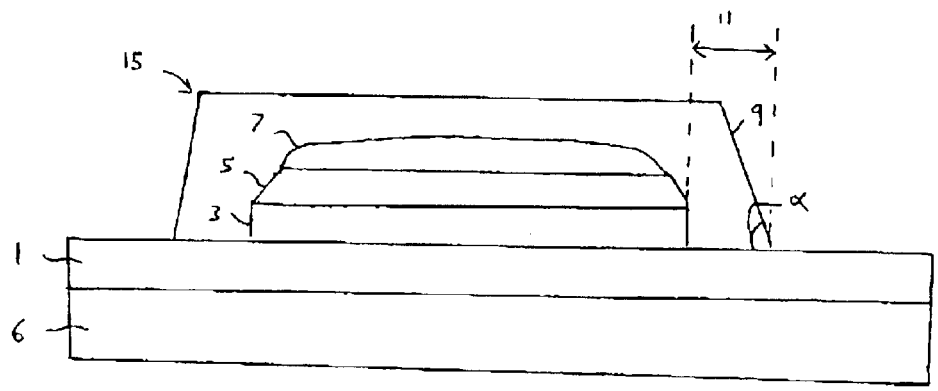
Figure 1D:
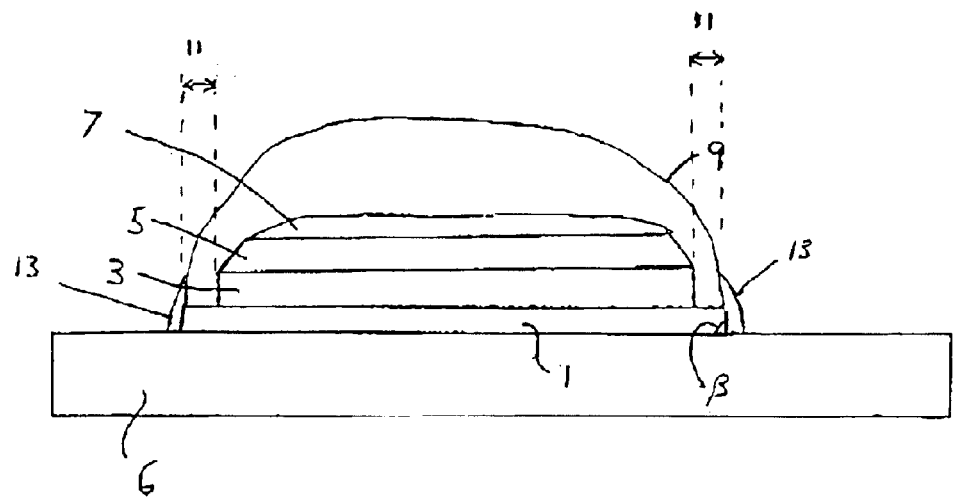
Figure 1E:
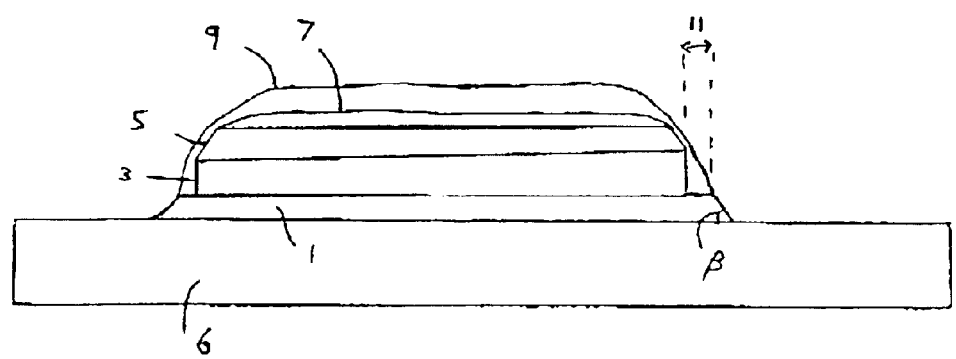
Figure 1F:
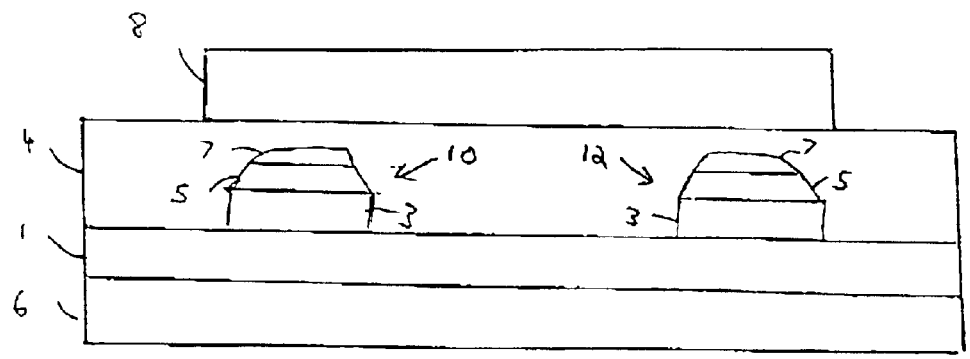
Figure 1G:
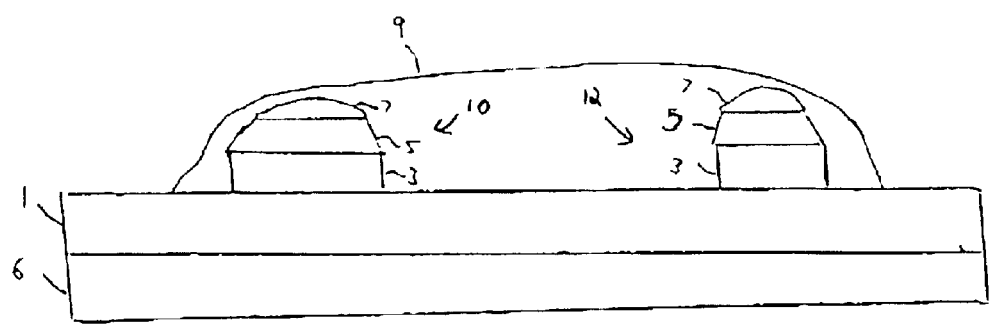
Figure 2A:
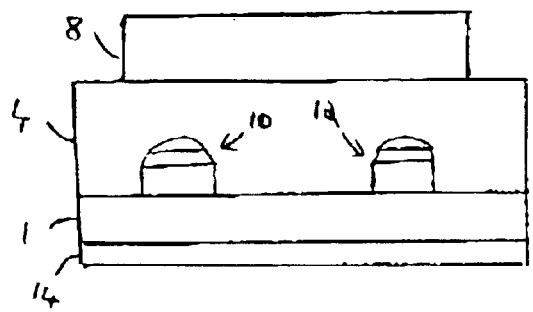
FIG. 2, which is composed of FIGS. 2(a) to 2(d) shows a method which is a first embodiment of the invention.

A first embodiment of the invention is shown in FIGS. 2(a) to 2(d), which use corresponding reference numerals to those used in FIGS. 1(a) to 1(f) to describe corresponding items. In the embodiment, there happen to be two ferrocapactitors 10, 12 under each of the second hard mask elements 9, but the invention is of course not limited in this respect, and they may for example be only one capacitor under each second hard mask elements 9. In FIG. 2(a) the barrier layer 14 (which is the upper layer of the substructure 6 of FIG. 1(a)) is shown.

Figure 2B:
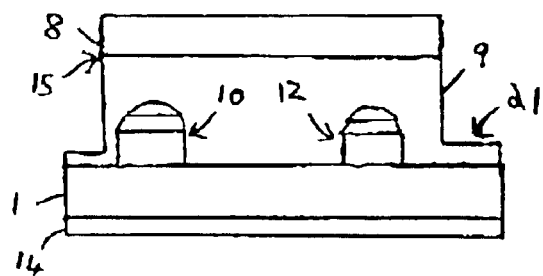

The structure shown in FIG. 2(a) is identical to that of FIG. 1(f), but the hard mask opening structure performed on it is different. Instead, as shown in FIG. 2(b) the hard mask layer 4 is only partially etched by the RIE process, so that the process in addition to forming the second hard mask elements 9 leaves portions 21 of the layer 4 remaining away from the resist elements 8. The resist 8 is reduced in this step, but is still adequate to protect the second hard mask elements 9, so that the corners 15 of the second hard mask elements are still not rounded.

Figure 2C:
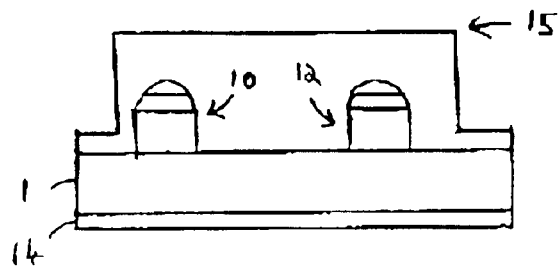

The resist 8 is then removed (ashing) to form the structure shown in FIG. 2(c), having corners 15.

Figure 2D:
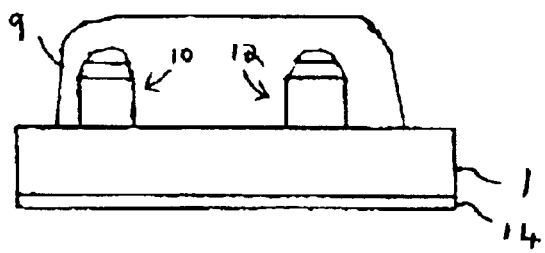

Then a second RIE etching step is performed, to round the corners 15 of the second hard mask elements 9, to form the structure of FIG. 2(d) having rounded corners 17. This process also removes the portions 21 of the layer 4. RIE etching of the bottom electrode 1 is then performed as in the conventional method. However, due to the rounding of the corners 15 second hard mask elements 9, hardly any residue is formed.

Figure 3A:
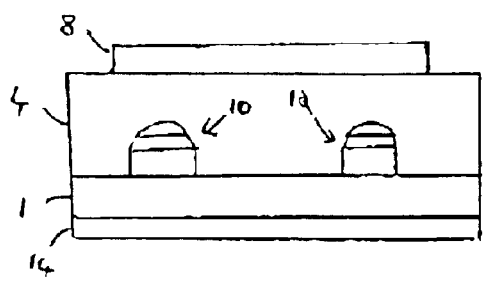
FIG. 3, which is composed of FIGS. 3(a) to 3(d), shows a method which is a second embodiment of the invention.
Figure 3B:
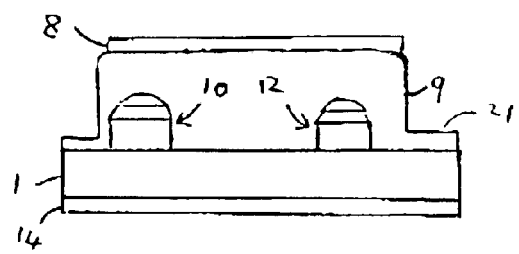

FIG. 3(a) to FIG. 3(d) show a second embodiment of the invention. In this embodiment, the initial structure shown in FIG. 3(a) is identical to that of FIG. 2(a) except that the resist 8 is thinner. This has the result that, following a first RIE etching step in which the hard mask layer 4 is partially removed to form the structure shown in FIG. 3(b), the remaining resist 8 is very thin: too thin to fully protect the second hard mask elements 9

Figure 3C:
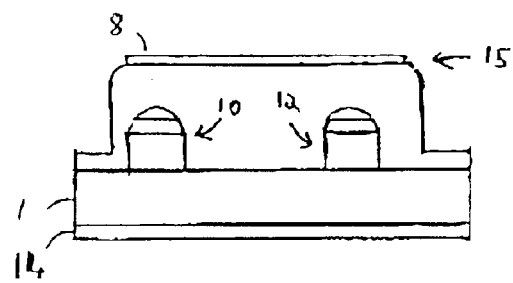
Figure 3D:
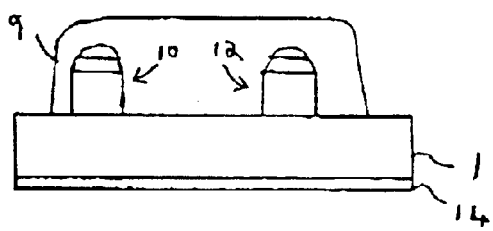

Further etching is continued, with the thin resist growing gradually thinner as shown in FIG. 3(c), so that the resist 8 provides very little protection to the second hard mask elements. The corners 15 become gradually more rounded during this process. The process can continue until, and even after, the resist is fully removed (any remaining remnants of the resist 8 can be removed by a further step if necessary), to give the structure shown in FIG. 3(d).

Each of the methods of FIGS. 3(a) to 3(d) and 4(a) to 4(d) include reducing the taper angle α. This may as a side-effect of the etching of the second hardmask elements (e.g. during the whole of the process running from FIG. 3(a) to FIG. 3(d), or the process from FIGS. 4(a) to 4(d)) by controlling the flow rate of $O_2$ and chamber pressure. Alternatively (or additionally), it may be by an additional process step specifically to modify the taper angle. The additional process step may be a low bias etching step (e.g. using $CF_4$ or another fluorine or chlorine compound) to adjust the taper angle after the ashing step, such as from almost 90° to a selected value.

Figure 4:
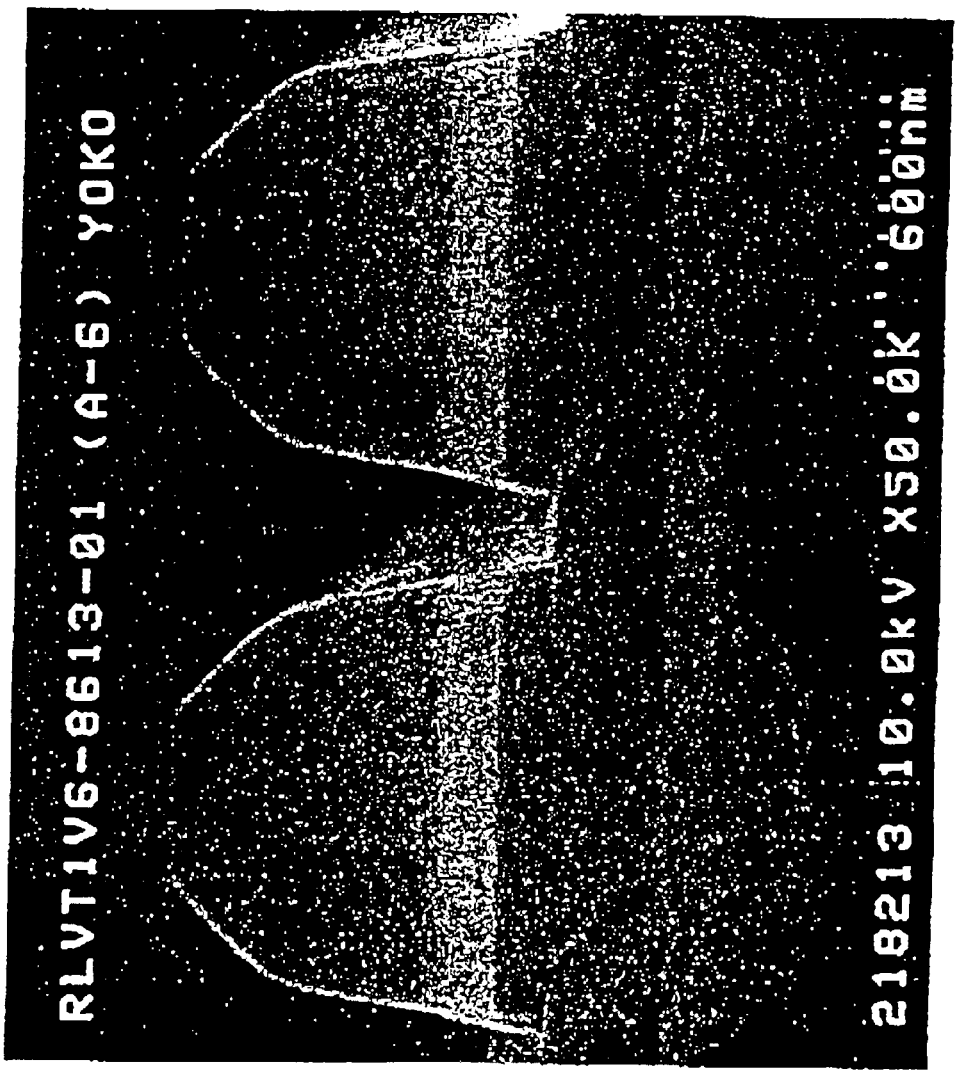
FIG. 4 is a scanning electron microscope (SEM) image of a ferrocapacitor produced by a method according to FIG. 2.
Figure 1A:
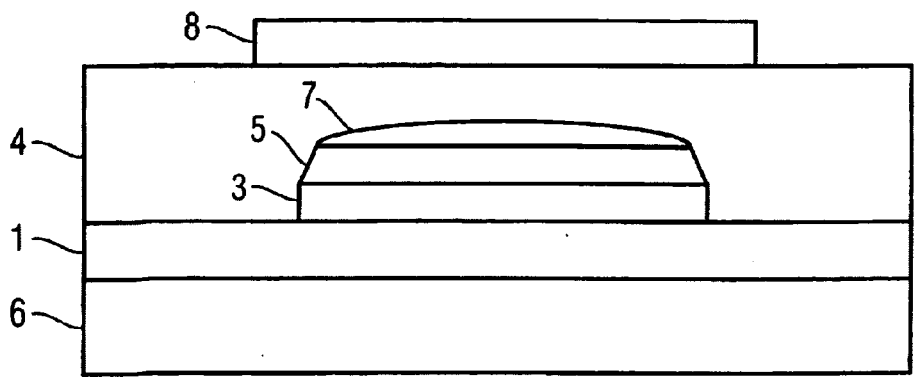
Figure 1B:
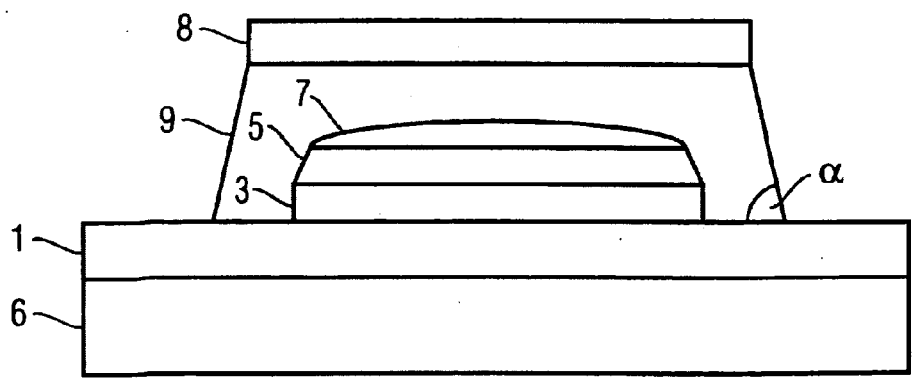
Figure 1C:
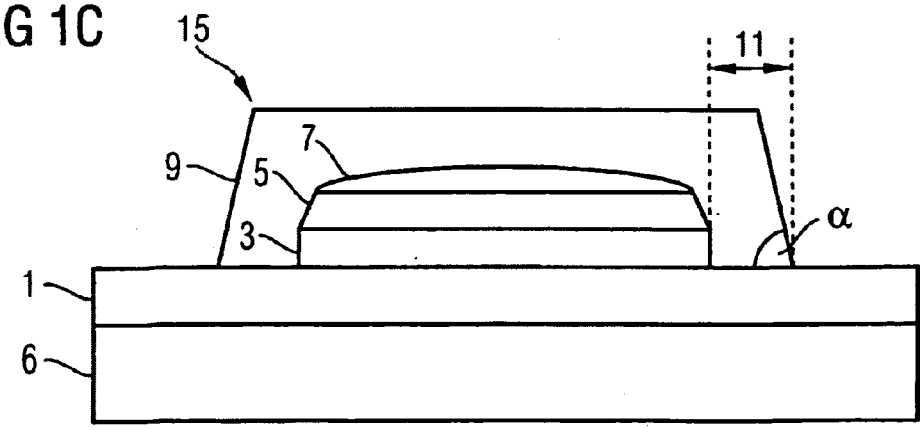
Figure 1D:
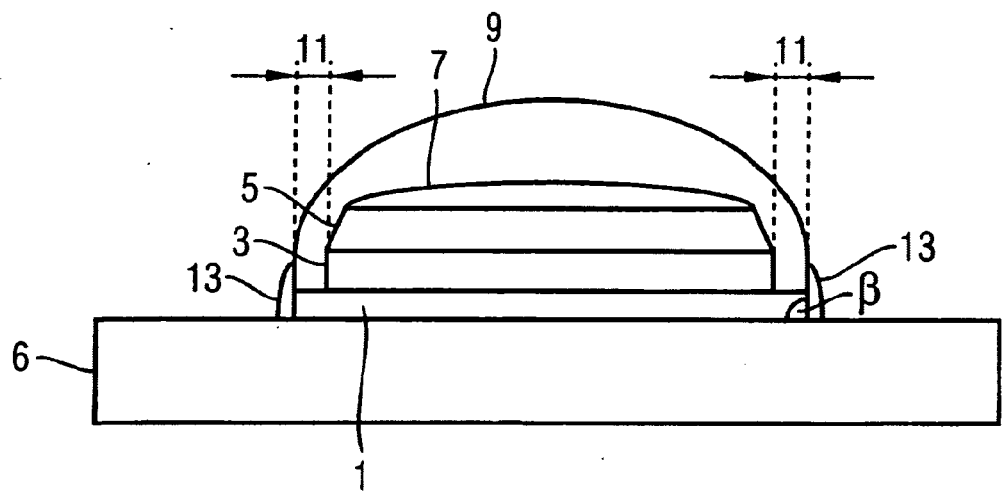
Figure 1E:
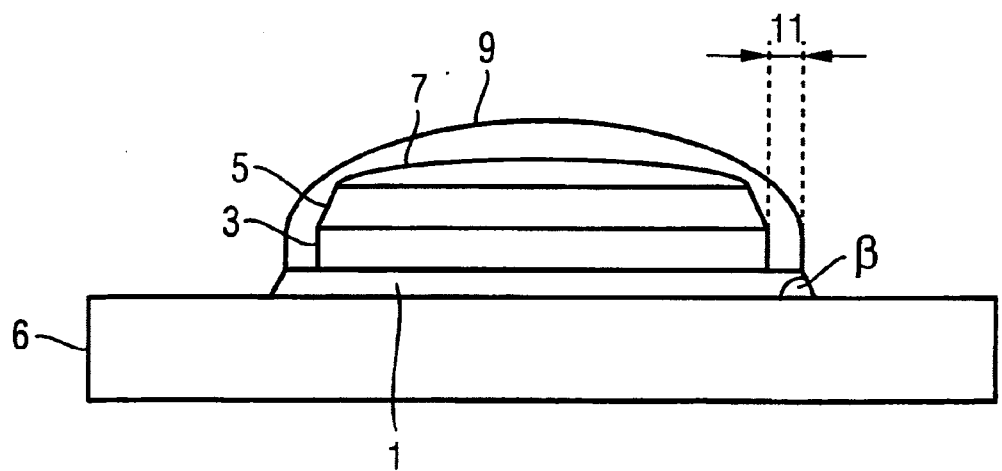
Figure 2A:
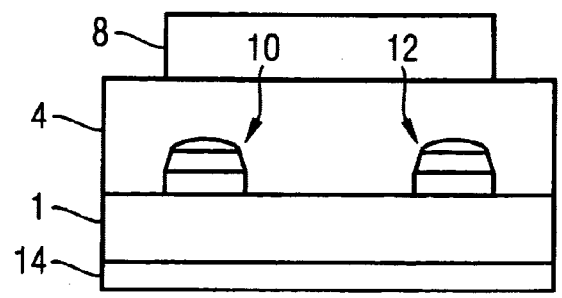
Figure 2B:
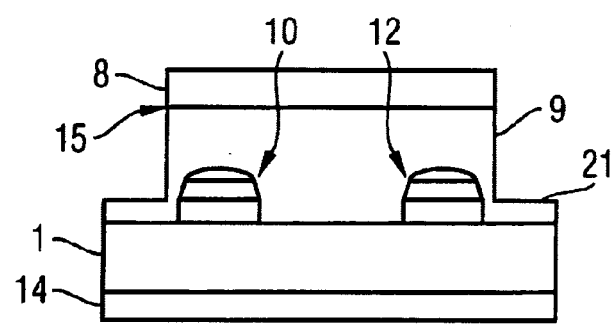
Figure 2C:
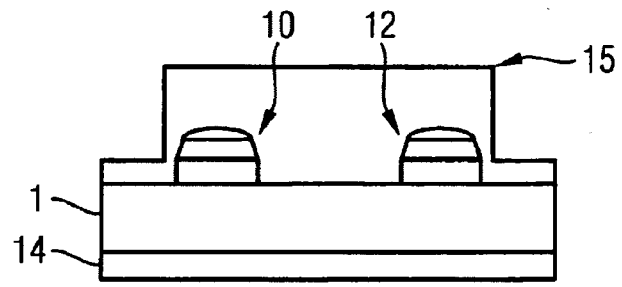
Figure 2D:
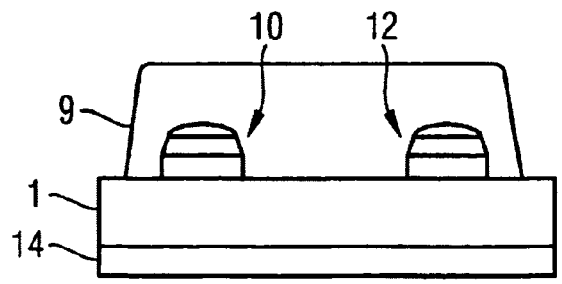
Figure 3A:
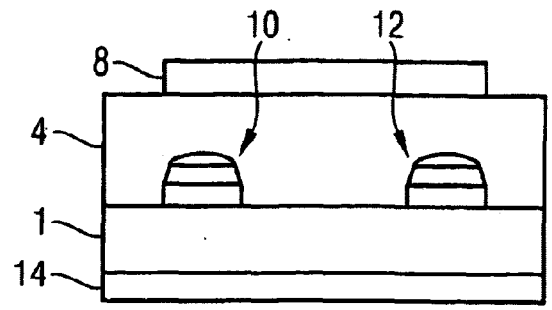
Figure 3B:
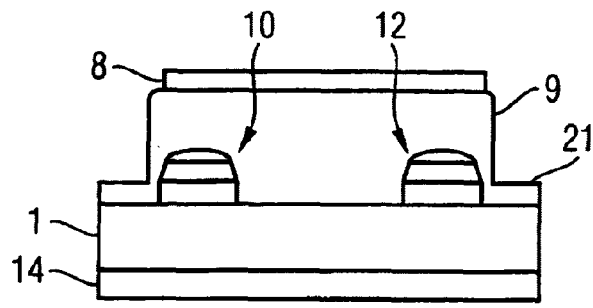
Figure 3C:
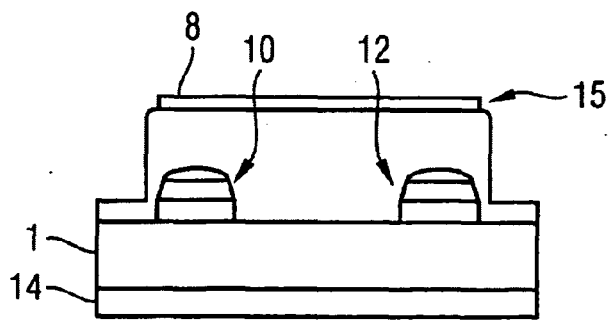
Figure 3D:
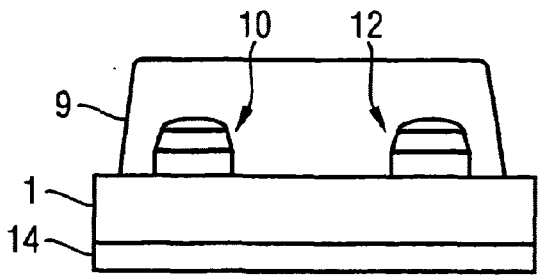
Figure 4:
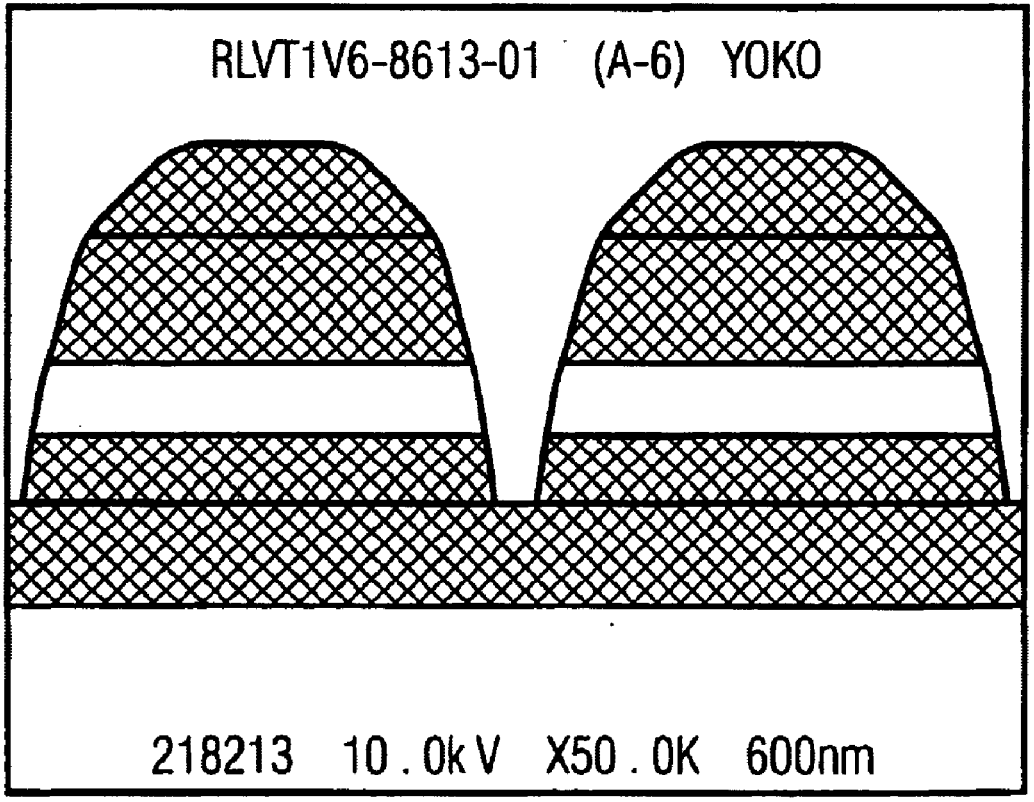
Figure 1A:
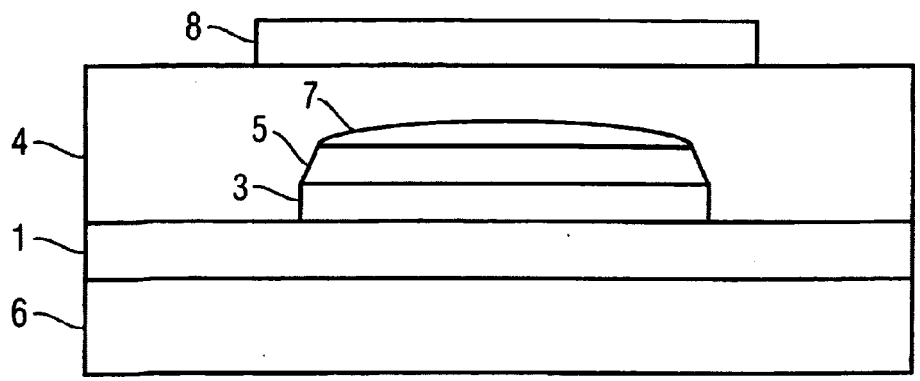
Figure 1B:
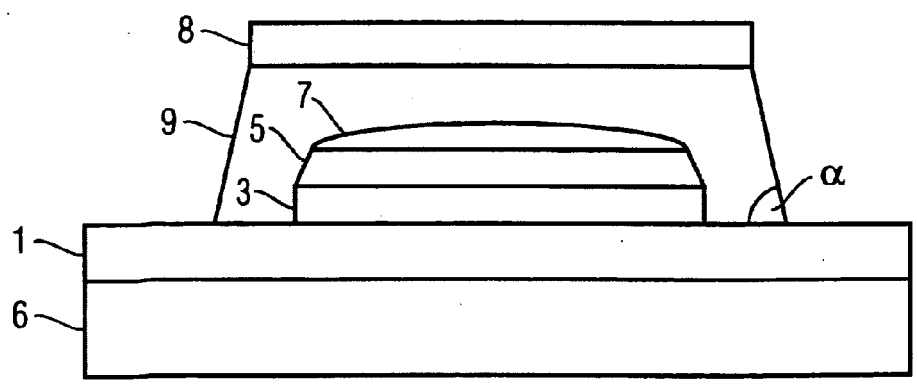
Figure 1C:
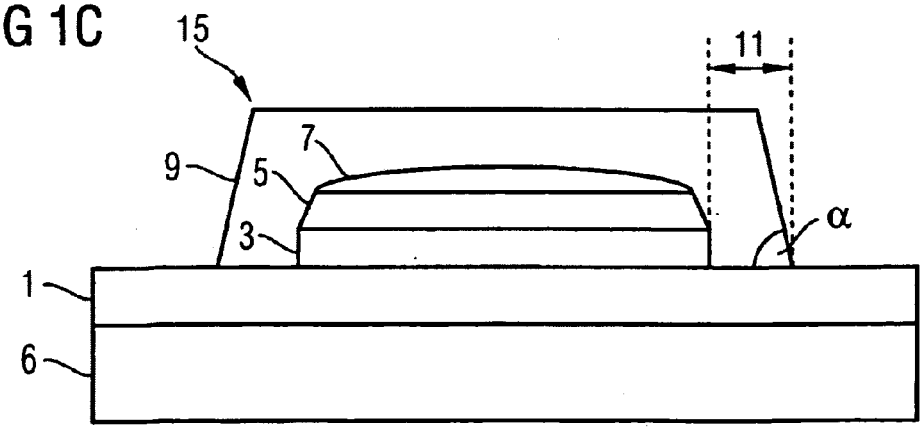
Figure 1D:
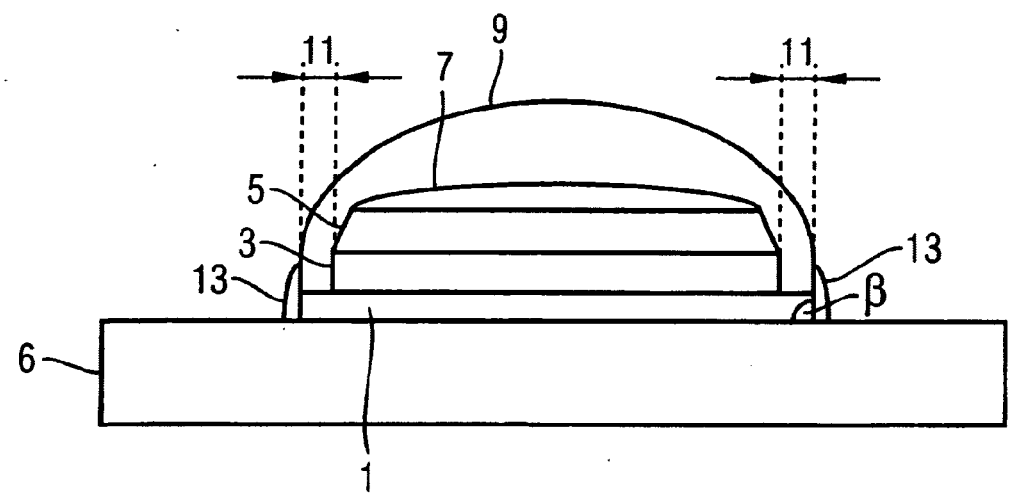
Figure 1E:
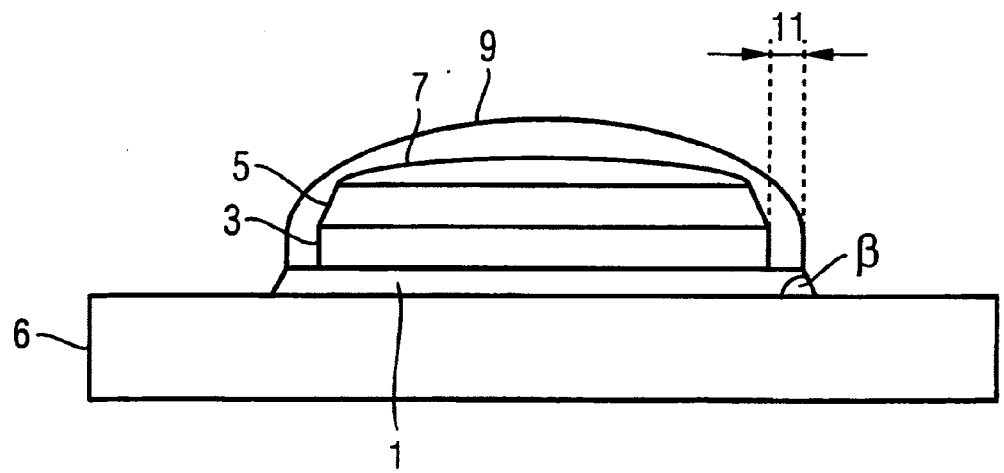
Figure 1F:
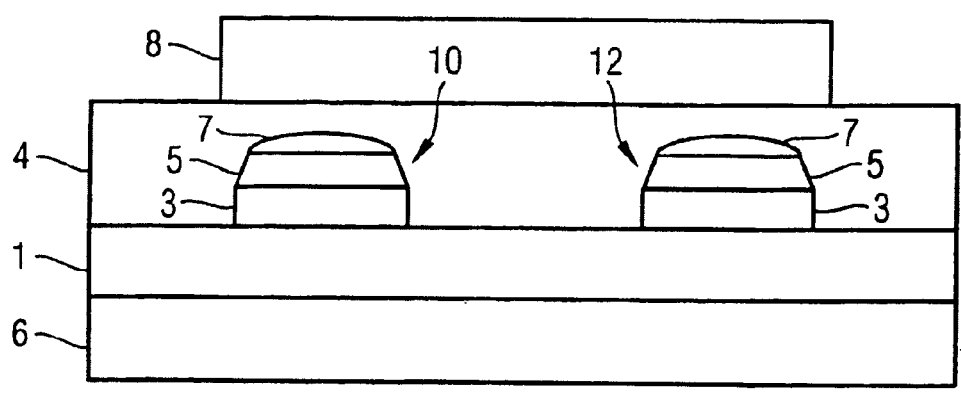
Figure 1G:
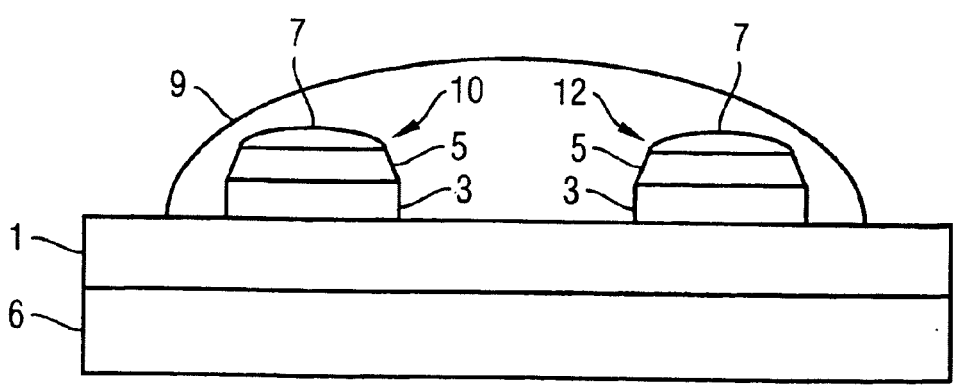
Figure 2A:
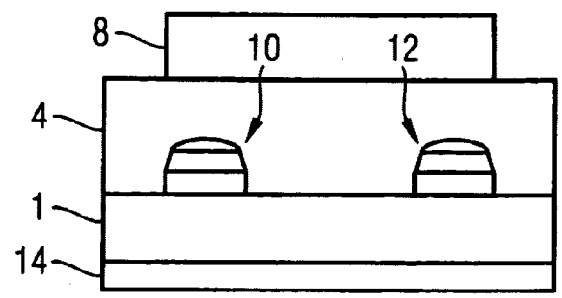
Figure 2B:
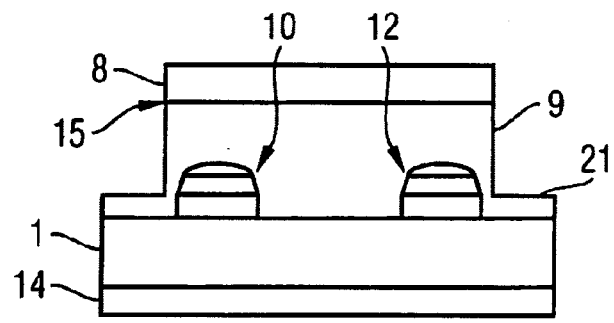
Figure 2C:
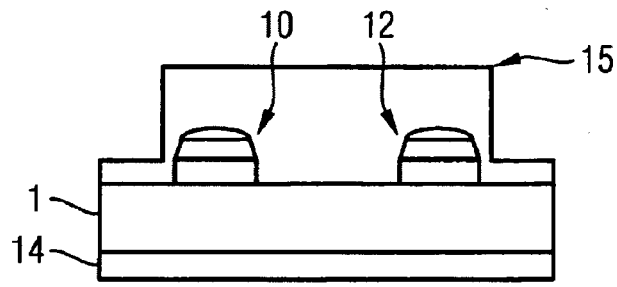
Figure 2D:
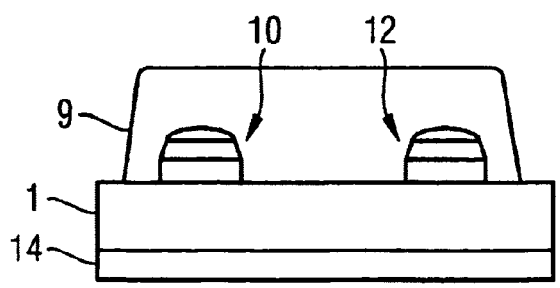
Figure 3A:
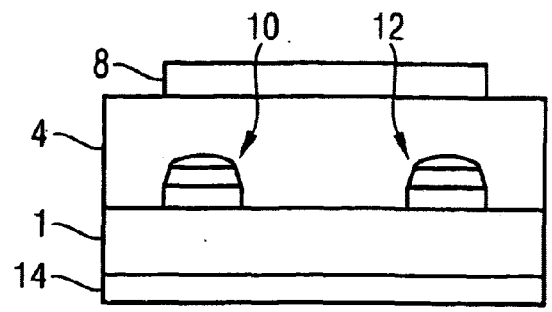
Figure 3B:
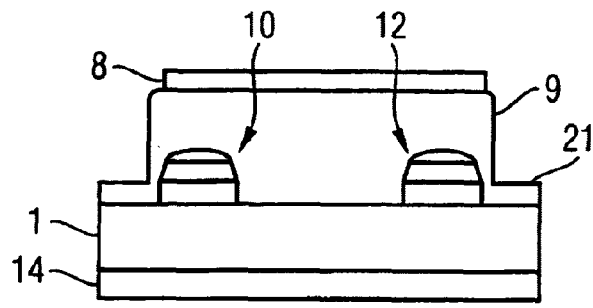
Figure 3C:
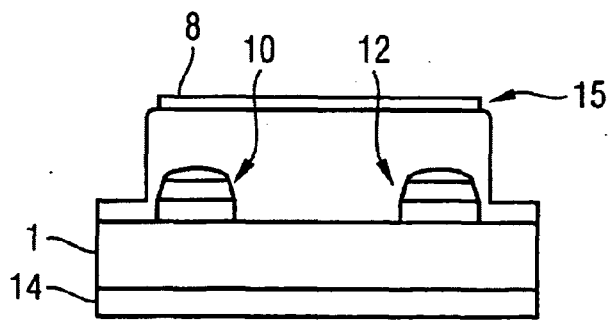
Figure 3D:
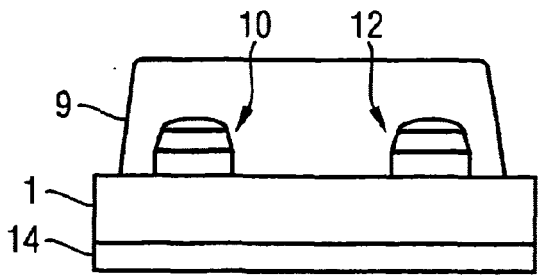
Figure 4:
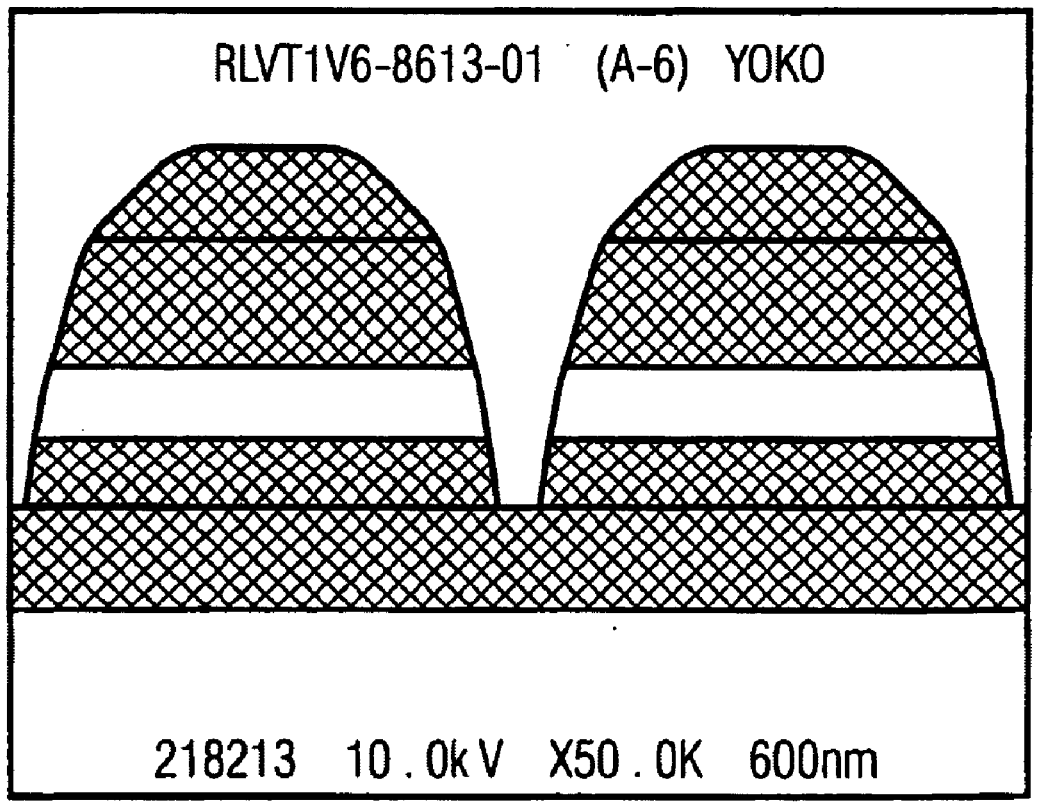

FIG. 4 is a scanning electron microscope (SEM) image of a ferrocapacitor produced by a method according to FIG. 2 using second hard mask elements 11 having a taper angle α of 83°, followed by a etch back process in which the uppermost 12% of the layer 4 is rounded (i.e. the lowermost part of the curved corner 15 is 12% of the thickness of the layer 4 from the top of the second hard mask elements 9). This results in a bottom electrode etching with a taper angle β of 76°, without residues being generated.

Experimentally, we have found that good results are obtained if the taper angle α is in the range 75–87°, and the etch back process is carried out to remove corners of the second hard mask elements in the uppermost 2–35% of the layer 4. Most desirably, the taper angle α is in the range 78–83°, and the etch back process is carried out to remove corners of the second hard mask elements in the uppermost 5–20% of the layer 4.

The bottom electrode 1 maybe formed of a structure of multiple layers, such as successive layers of $Ir/Ir/IrO_2/Pt$, or Ir/Ir/Pt or Ir/Pt An Ir/Ir/Pt structure is preferred, since this gives remarkably low residues. However, the invention is not limited in terms of the construction of the bottom electrode.

We have found that particularly good results are obtained using the method when the thickness of the second hard mask elements 9 is between 2 and 6 times the thickness of the bottom electrode layer, and/or the total thickness of the bottom electrode layer is in the range from 100 nm to 300 nm.

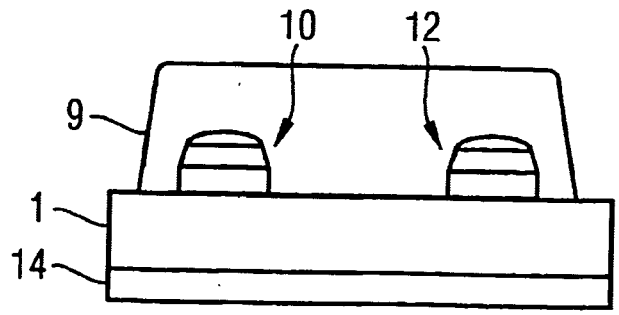

What is claimed is:

1. A method for formation of a ferrocapacitor, comprising the steps of:
   depositing first hard mask elements over a structure including in order on a substructure, a bottom electrode layer, a ferroelectric layer and a top electrode layer;
   etching the top electrode layer and ferroelectric layer;
   forming second hard mask elements over the first hard mask elements, the second hard mask elements being wider than the first hard mask elements;
   modifying the profile of the second hard mask elements to round their corners; and
   etching the bottom electrode layer.

2. A method according to claim 1 in which the second hard mask elements are formed by a process including depositing resist over a hard mask layer, and etching the portions of the hard mask layer not covered by the resist, the step of modifying the profile of the second hard mask elements being performed by removing the resist and subjecting to the hard mask elements to a further etching step before the bottom electrode layer is etched.

3. A method according to claim 1 in which the second hard mask element are formed by a process including depositing resist over a hard mask layer, and etching the portions of the hard mask layer not covered by the resist, the etching reducing the thickness of the resist to a level at which the etching modifies the profile of the second hard mask elements before the bottom electrode layer is etched.

4. A method according to claim 1 in which when the bottom electrode layer is etched the second hard mask elements have an initial taper angle at their edges in the range 75–87°.

5. A method according to claim 1 in which when the bottom electrode layer is etched the second hard mask elements have an initial taper angle at their edges in the range 78–83°.

6. A method according to claim 4 including a step of modifying the taper angle of the second hard mask elements before the bottom electrode is etched.

7. A method according to claim 6 in which the taper angle of the second hard mask elements is modified by control of the etchant flow rate and pressure during the etching process.

8. A method according to claim 6 in which the taper angle of the second hard mask elements is reduced by an additional etching step.

9. A method according to claim 1 in which, during the modification of the profile of the second hard mask elements, the top 2 to 35% of the second hard mask elements is rounded.

10. A ferroelectric device including a ferrocapacitor produced by a method according to claim 1.

* * * * *

UNITED STATES PATENT AND TRADEMARK OFFICE
CERTIFICATE OF CORRECTION

PATENT NO. : 6,762,064 B1
DATED : July 13, 2004
INVENTOR(S) : Haoren Zhuang, Ulrich Egger and Kazuhiro Tomioka It is certified that error appears in the above-identified patent and that said Letters Patent is hereby corrected as shown below:

The title page, showing the illustrative figure should be deleted to be replaced with the attached title page.

Drawing sheets, consisting of Figs. 1A-4, should be deleted to be replaced with the drawing sheets, consisting of Figs. 1A-4, as shown on the attached page.

Signed and Sealed this

Sixteenth Day of August, 2005

JON W. DUDAS
*Director of the United States Patent and Trademark Office*

(12) United States Patent
Zhuang et al.

(10) Patent No.: US 6,762,064 B1
(45) Date of Patent: Jul. 13, 2004

(54) PROCESS FOR FABRICATION OF A FERROCAPACITOR

(75) Inventors: Haoren Zhuang, Tokyo-to (JP); Ulrich Egger, Kanagawa-ken (JP); Kazuhiro Tomioka, Kanagawa-ken (JP)

(73) Assignees: Infineon Technologies AG (DE); Kabushiki Kaisha Toshiba (JP)

( * ) Notice: Subject to any disclaimer, the term of this patent is extended or adjusted under 35 U.S.C. 154(b) by 0 days.

(21) Appl. No.: 10/417,526

(22) Filed: Apr. 17, 2003

(51) Int. Cl.⁷ .............................................. H01L 21/00
(52) U.S. Cl. ........................ 438/3; 438/240; 438/713; 438/720; 438/736
(58) Field of Search ................ 438/3, 240, 253, 438/255, 398, 713, 720, 735, 736

(56) References Cited

U.S. PATENT DOCUMENTS

| | | | |
|---|---|---|---|
| 5,515,984 A | * 5/1996 | Yokoyama et al. | 216/41 |
| 6,497,992 B1 | * 12/2002 | Yunogami et al. | 430/313 |
| 6,500,678 B1 | * 12/2002 | Aggarwal et al. | 438/3 |
| 6,611,014 B1 | * 8/2003 | Kanaya et al. | 257/295 |
| 2003/0170998 A1 | * 9/2003 | Mise et al. | 438/710 |

\* cited by examiner

*Primary Examiner*—Tuan H. Nguyen
(74) *Attorney, Agent, or Firm*—Lerner, David, Littenberg, Krumholz & Mentlik, LLP

(57) ABSTRACT

A process for the fabrication of a ferrocapacitor comprising depositing a first mask element 7 over a structure having a bottom electrode 1, a ferroelectric layer 3 and a top electrode 5. RIE etching is performed to remove portions of the top electrode 5 and the ferroelectric layer 3. Then a second hard mask element 9 is deposited over the first hardmask element. The second hard mask element is rounded by an etch back process, and its taper angle is controlled to be in the range 75–87°. A second RIE etching process is performed to remove portions of the bottom electrode 1. Due to the rounding of the second hard mask elements 9 low residues are formed on the sides of the etched bottom electrode 1.

10 Claims, 6 Drawing Sheets

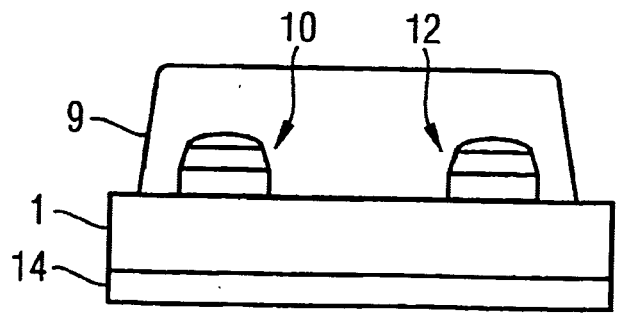

UNITED STATES PATENT AND TRADEMARK OFFICE
CERTIFICATE OF CORRECTION

| | | |
|---|---|---|
| PATENT NO. | : 6,762,064 B1 | Page 1 of 8 |
| APPLICATION NO. | : 10/417526 | |
| DATED | : July 13, 2004 | |
| INVENTOR(S) | : Haoren Zhuang, Ulrich Egger and Kazuhiro Tomioka | |

It is certified that error appears in the above-identified patent and that said Letters Patent is hereby corrected as shown below:

The title page, showing the illustrative figure should be deleted to be replaced with the attached title page.

Drawing sheets, consisting of Figs. 1A-4, should be deleted to be replaced with the drawing sheets, consisting of Figs. 1A-4, as shown on the attached page.

This certificate supsersedes Certificate of Correction issued August 16, 2005.

Signed and Sealed this

Eighth Day of August, 2006

JON W. DUDAS
*Director of the United States Patent and Trademark Office*

United States Patent
Zhuang et al.

(10) Patent No.: US 6,762,064 B1
(45) Date of Patent: Jul. 13, 2004

(54) PROCESS FOR FABRICATION OF A FERROCAPACITOR

(75) Inventors: Haoren Zhuang, Tokyo-to (JP); Ulrich Egger, Kanagawa-ken (JP); Kazuhiro Tomioka, Kanagawa-ken (JP)

(73) Assignees: Infineon Technologies AG (DE); Kabushiki Kaisha Toshiba (JP)

( * ) Notice: Subject to any disclaimer, the term of this patent is extended or adjusted under 35 U.S.C. 154(b) by 0 days.

(21) Appl. No.: 10/417,526

(22) Filed: Apr. 17, 2003

(51) Int. Cl.$^7$ ............................................. H01L 21/00
(52) U.S. Cl. ........................ 438/3; 438/240; 438/713; 438/720; 438/736
(58) Field of Search ...................... 438/3, 240, 253, 438/255, 398, 713, 720, 735, 736

(56) References Cited

U.S. PATENT DOCUMENTS

| | | | |
|---|---|---|---|
| 5,515,984 A | * 5/1996 | Yokoyama et al. | ........... 216/41 |
| 6,497,992 B1 | * 12/2002 | Yunogami et al. | ........... 430/313 |
| 6,500,678 B1 | * 12/2002 | Aggarwal et al. | ............. 438/3 |
| 6,611,014 B1 | * 8/2003 | Kanaya et al. | ............... 257/295 |
| 2003/0170998 A1 | * 9/2003 | Mise et al. | .................. 438/710 |

* cited by examiner

*Primary Examiner*—Tuan H. Nguyen
(74) *Attorney, Agent, or Firm*—Lerner, David, Littenberg, Krumholz & Mentlik, LLP

(57) ABSTRACT

A process for the fabrication of a ferrocapacitor comprising depositing a first mask element 7 over a structure having a bottom electrode 1, a ferroelectric layer 3 and a top electrode 5. RIE etching is performed to remove portions of the top electrode 5 and the ferroelectric layer 3. Then a second hard mask element 9 is deposited over the first hardmask element. The second hard mask element is rounded by an etch back process, and its taper angle is controlled to be in the range 75–87°. A second RIE etching process is performed to remove portions of the bottom electrode 1. Due to the rounding of the second hard mask elements 9 low residues are formed on the sides of the etched bottom electrode 1.

10 Claims, 6 Drawing Sheets